United States Patent
Krautschneider et al.

Patent Number: 5,973,373
Date of Patent: *Oct. 26, 1999

[54] READ-ONLY-MEMORY CELL ARRANGEMENT USING VERTICAL MOS TRANSISTORS AND GATE DIELECTRICS OF DIFFERENT THICKNESSES AND METHOD FOR ITS PRODUCTION

[75] Inventors: Wolfgang Krautschneider, Hohenthann; Lothar Risch, Neubiberg; Franz Hofmann; Wolfgang Rösner, both of München, all of Germany

[73] Assignee: Siemens Aktiengesellschaft, Munich, Germany

[*] Notice: This patent issued on a continued prosecution application filed under 37 CFR 1.53(d), and is subject to the twenty year patent term provisions of 35 U.S.C. 154(a)(2).

[21] Appl. No.: 08/817,630
[22] PCT Filed: Sep. 14, 1995
[86] PCT No.: PCT/DE95/01262
  § 371 Date: Mar. 26, 1997
  § 102(e) Date: Mar. 26, 1997
[87] PCT Pub. No.: WO96/10266
  PCT Pub. Date: Apr. 4, 1996

[30] Foreign Application Priority Data

Sep. 28, 1994 [DE] Germany ............................ 44 34 725

[51] Int. Cl.⁶ ........................... H01L 29/76; H01L 29/94; H01L 31/062; H01L 31/113
[52] U.S. Cl. .......................... 257/390; 257/330; 257/392; 438/270; 438/275
[58] Field of Search ..................................... 257/330, 334, 257/390, 391, 392; 438/270, 271, 275

[56] References Cited

U.S. PATENT DOCUMENTS

| | | | |
|---|---|---|---|
| 4,663,644 | 5/1987 | Shimizu | 257/332 |
| 4,774,556 | 9/1988 | Fujii et al. | 257/316 |
| 4,814,840 | 3/1989 | Kameda | 257/316 |
| 4,847,808 | 7/1989 | Kobatake | 257/391 |
| 4,954,854 | 9/1990 | Dhong et al. | 257/331 |
| 5,200,802 | 4/1993 | Miller | 257/390 |
| 5,300,804 | 4/1994 | Arai | 257/332 |
| 5,576,573 | 11/1996 | Su et al. | 257/391 |
| 5,597,753 | 1/1997 | Sheu et al. | 438/275 |
| 5,641,694 | 6/1997 | Kenney | 438/156 |

FOREIGN PATENT DOCUMENTS

| | | | |
|---|---|---|---|
| 0 376 568 | 4/1990 | European Pat. Off. | |
| 35 27502A1 | 12/1986 | Germany | |
| 42 14 923A1 | 3/1992 | Germany | |
| 63-102372 | 5/1963 | Japan | |
| 3-190165 | 8/1991 | Japan | |
| 4-226071 | 8/1992 | Japan | 257/390 |

OTHER PUBLICATIONS

Patent Abstracts of Japan, Publication No. JP4062966, Publication Date Feb. 27, 1992, vol. 16, No. 271, Publication Date Feb. 27, 1992.

*Primary Examiner*—Olik Chaudhuri
*Assistant Examiner*—Howard Weiss
*Attorney, Agent, or Firm*—Hill & Simpson

[57] ABSTRACT

A read-only-memory cell arrangement comprises memory cells, each having a vertical MOS transistor, in a substrate (21) made of semiconductor material, the various logic values (zero, one) being implemented by gate dielectrics (27, 28) of different thickness. The memory cell arrangement can preferably be produced in a silicon substrate, with a small number of process steps and a high packing density. The memory cell arrangement and a drive circuit for readout can in this case be produced in an integrated manner.

17 Claims, 6 Drawing Sheets

READ-ONLY-MEMORY CELL ARRANGEMENT USING VERTICAL MOS TRANSISTORS AND GATE DIELECTRICS OF DIFFERENT THICKNESSES AND METHOD FOR ITS PRODUCTION

BACKGROUND OF THE INVENTION

1. Field of the Invention

The present invention relates generally to a read only memory based in semiconductor technology having a vertical MOS transistor.

2. Description of the Related Art

Memories into which data are written permanently in a digital form are required for many electronic systems. Such memories are called, inter alia, read-only-memories.

Plastic disks which are coated with aluminium are in widespread use as read-only-memories for storing very large quantities of data. These plastic disks have two different kinds of point-like depressions in the aluminum coating, which are assigned to the logic values zero and one. The information is stored digitally in the arrangement of these depressions. Such disks are called compact disks, or CDs, and are in widespread use for the digital storage of music.

In order to read the data which are stored on a compact disk, a read apparatus is used in which the disk rotates mechanically. The point-like depressions are scanned via a laser diode and a photo cell. Typical scanning rates in this case are 2×40 kHz. 4 GBits of information can be stored on one plastic compact disk.

The read apparatus has moving parts which are subject to mechanical wear, occupy a comparatively large spaces and allow only slow data access. Furthermore, the read apparatus is sensitive to vibration and can thus be used only to a limited extent in mobile systems.

Read-only-memories based on semiconductor technology are known for the storage of smaller quantities of data. These are widely implemented as a planar integrated silicon circuit, in which MOS transistors are used. The transistors are selected via the gate electrode, which is connected to the word line. The input of the MOS transistor is connected to a reference line, and the output to a bit line. An assessment is carried out during the reading process to determine whether any current is or is not flowing through the transistor. The logic values zero and one are assigned accordingly. Technically, the storage of logical zero and one values brought about in that no MOS transistor is produced or no conductive connection to the bit line is implemented in memory cells in which the logic value assigned to the state "no current flow through the transistor" is stored. Alternatively, MOS transistors which have different operating voltages as a result of different implantations in the channel region can be implemented for the two logic values.

These memories based on semiconductor technology allow random access to the stored information. The electrical power which is required to read the information from the semiconductor memory is considerably less than in the case of a read apparatus having a mechanical drive. Since no mechanical drive is required to read the information, the problems of mechanical wear and the sensitivity to vibration are illuminated. Read-only-memories based on a semiconductor technology can thus also be used for mobile systems.

The silicon memories described have a planar construction. As a consequence, a minimal surface area, which is about 6 to 8 $F^2$, is required per memory cell, F being the smallest producible structure size in the respective technology. Planar silicon memories are thus limited to memory densities of about 0.14 bit/$\mu m^2$ when using one-$\mu m$ technology.

U.S. Pat. No. 4,954,854 discloses the use of vertical MOS transistors in a read-only-memory. The surface of a silicon substrate is for this purpose provided with trenches against which a source region abuts at the base, against which a drain region abuts at the substrate surface and along whose flanks a channel region is arranged. The surface of the trench is provided with a gate dielectric, and the trench is filled with a gate electrode. Logical zero and one values are distinguished in this arrangement by no trench being etched and no transistor being produced for one of-the logic values.

German Patent Document DE 42 14 923 A1 discloses a read-only-memory cell arrangement whose memory cells comprise MOS transistors. These MOS transistors are arranged along trenches such that a source region abuts the base of the trench, a drain region abuts the surface of the substrate, and a channel region abuts the flank and base of the trench both vertically with respect to the surface of the substrate and parallel to the surface of the substrate. The surface of the channel region is provided with a gate dielectric. The gate electrode is designed as a flank covering or (spacer). The logic values zero and one are distinguished by different operating voltages, which are brought about by channel implantation. During the channel implantation, the ions being implanted strike the surfaces of the respective trench at such an angle that implantation is carried out, deliberately, along only one flank as a result of shadowing effects of the opposite flank.

SUMMARY OF THE INVENTION

The present invention is based on the problem of providing a read-only-memory cell arrangement based on semi-conductor technology, in the case of which an increased memory density is achieved and which can be produced with a small number of production steps and with a high yield. Furthermore, it is intended to provide a method for production of such a memory cell arrangement.

This problem is solved according to the invention by a read-only-memory cell arrangement in the case of which a substrate made of semi-conductor material is provided which comprises memory cells arranged in a cell field in the area of one main surface, the memory cells each comprise an MOS transistor having two source/drain regions, a channel region, a gate dielectric and a gate electrode, one of whose source/drain regions is connected to a reference line and whose other source/drain region is connected to a bit line, and whose gate electrode is connected to a word line, and a current flow runs between the source/drain regions essentially at right angles to the main surface, the memory cells comprise first memory cells in which a first logic value is stored in that the thickness of the gate dielectric is dimensioned such that a current flows via the bit line when a selection signal is applied to the word line, the memory cells comprise second memory cells in which a second logic value is stored in that the thickness of the gate dielectric is dimensioned such that no current flows via the bit line when the selection signal is applied to the word line.

Advantages of the invention are provided wherein the substrate comprises monocrystalline silicon, at least in the region of the main surface, essentially parallel trenches run in the main surface, the source/drain regions and the channel region in each case abut the surface of the respective trench, the channel region abutting a flank of the trench which flank is at right angles to the main surface, and a plurality of MOS transistors abut each trench.

Preferably, the thickness of the gate dielectric of the MOS transistors in the second memory cells is at least ten times the thickness of the gate dielectric of the MOS transistors in the first memory cells.

In one embodiment, a first flank of each trench is provided with an insulation layer, while the channel regions of the MOS transistors which abut the respective trench abut a second flank of the respective trench, which second flank is opposite the first flank. Specifically, each trench has a first flank and a second flank, which are opposite one another, MOS transistors are arranged along the first flank and along the second flank, the gate electrodes of the MOS transistors are designed as flank covering (or spacer) made of conductive material, an insulating flank covering is arranged in the second memory cells between the gate electrode and the respective flank of the trench, the gate electrodes of the MOS transistors which are arranged along the first flank of a trench are electrically insulated from the gate electrodes of the MOS transistors which are arranged along the second flank of the same trench. The gate electrodes of MOS transistors which are arranged along one flank are implemented as continuous flank covering which forms a word line and has a contact at the edge of the cell field, the contacts to adjacent word lines are arranged on opposite sides of the cell field, which contacts which are arranged on one side of the cell field are arranged offset.

In one application, the memory cell arrangement provides that the substrate additionally comprises MOS transistors, which are arranged outside the cell field, of a read-out circuit.

The present invention also provides a method for production of a read-only-memory cell arrangement, in the case of which a cell field having memory cells with in each case one MOS transistor is produced in a substrate made of semiconductor material, trenches which run essentially parallel are etched in one main surface of the substrate, doped regions are produced for the MOS transistors in the substrate, doped regions abut the surface of a trench, channel regions in each case abutting a flank of the trench which flank is at right angles to the main surface, and a plurality of MOS transistors abutting each trench, a gate dielectric and a gate electrode are in each case produced on the surface of the channel regions, the gate dielectric is produced with a smaller thickness in MOS transistors which store a first logic value than in MOS transistors which store a second logic value, such that a current flows through the MOS transistor when a read-out signal is applied to the gate electrode of an MOS transistor which is storing the first logic value, while no current flows through the MOS transistor when the same read-out signal is applied to the gate electrode of an MOS transistor which is storing the second logic value.

As a refinement on the method, the substrate is doped by a first conductance type; after the etching of the trenches, an insulating layer having an essentially conformal edge covering is applied over the entire area; an implantation is carried out using ions doped by a second conductance type, which is opposite to the first conductance type, during which implantation doped regions are produced on the base of the trenches and in the main surface between the trenches; the insulating layer is removed by etching, using a photoresist mask, at least along those flanks of the trenches abutted by the channel regions of MOS transistors which store the first logic value; a gate oxidation is carried out in order to produce the gate dielectric in each case on the exposed flanks of the trenches; a conductive layer having essentially conformal edge covering is deposited; in order to form the gate electrodes, the conductive layer is structured such that word lines are produced which are in the form of strips and run transversely with respect to the trenches, and the doped regions on the base of the trenches and between the trenches are provided with contacts at the edge of the cell field.

As further provided, the method includes forming source/drain regions for MOS transistors of a drive circuit outside the cell field during the implantation in order to produce the doped regions in the cell field; during the gate oxidation, gate dielectrics are formed for the MOS transistors of the drive circuits; and during the structuring of the conductive layer gate electrodes of the MOS transistors of the drive circuit are formed from the conductive layer.

In one embodiment, the substrate is composed of monocrystalline silicon, the insulating layer is formed from $SiO_2$, the gate dielectric is formed from $SiO_2$, and the conductive layer is formed from doped polysilicon.

The present method provides for the steps wherein the substrate is doped by a first conductance type, a well is produced which is doped by a second conductance type, which is opposite to the first conductance type, abuts the main surface and covers at least the area for the cell field, the trenches are etched so deeply that the substrate which is doped by the first conductance type is exposed at least on the base of the trenches, an insulating layer is produced over the entire area, the insulating layer is removed by etching, using a mask, along those flanks of the trenches which abut the MOS transistors which store the first logic value, after removal of the mask by means of an anisotropic etching which is selective with respect to the substrate, insulating flank coverings are formed from the structured insulating layer, a gate oxidation is carried out in order to produce a gate oxide layer in each case on the exposed flanks of the trenches, a conductive layer having essentially conformal edge covering is deposited, conductive flank coverings, which line the flanks of the trenches in an annular shape, are formed from the conductive layer by anisotropic, selective etching, the annular, conductive flank coverings are interrupted by etching in each case at at least two points, a planarizing insulation layer is produced over the entire area, contact holes, which extend to the surface of the doped well, are etched in the planarizing insulation layer, doped source/drain regions, which abut the main surface in the area of the contact holes, are produced by implantation, the contact holes are provided with a metallization, and contacts to the conductive flank coverings are formed at the edge of the cell field.

This method is further defined by an insulating layer having essentially conformal edge covering being deposited in the contact holes before the formation of the metallization, which insulating layer is etched using an anisotropic, selective etching, the surface of the source/drain regions which abut the main surface being at least partially exposed.

Insulating trenches are produced, for insulation, between source/drain regions which are adjacent along a trench, which insulating trenches are produced by trench etching and filling with insulating material before the etching of the first-mentioned trenches.

Gate electrodes for MOS transistors of a drive circuit are additionally formed from the conductive layer outside the cell field, and source/drain regions, which are doped by the first conductance type, for the MOS transistors of the drive circuit are formed by implantation before the application of the planarizing insulation layer.

In a specific embodiment, the substrate is composed of monocrystalline silicon, the insulating layer and the gate oxide layer are formed from SiO$_2$, the conductive layer is formed from doped polysilicon, the planarizing insulation layer is formed from boron-phosphorus-silicate glass.

The read-only-memory cell arrangement according to the invention comprises MOS transistors in which a current flow takes place between the source region and the drain region essentially at right angles to the surface of the substrate. In order to distinguish between the two logic values zero and one, the MOS transistors have gate dielectrics of different thicknesses. Use is in this case made of the fact that, if the thicknesses of the gate dielectrics differ by a factor of 10 or more, the operating voltages of the MOS transistors are so clearly distinguished that, if a selection signal is applied at a level between the two operating voltages, one of the MOS transistors conducts and that having the thicker gate dielectric does not conduct.

A substrate made of monocrystalline silicon or an SOI silicon on insulator substrate, in whose silicon layer the memory cell arrangement is implemented, is preferably suitable as the semiconductor substrate. For large-scale applications, such as data media for information or digitally stored music for example, a semiconductor substrate made of monocrystalline silicon is preferred.

The different thickness of the gate dielectrics is preferably achieved by application of an insulating layer which is selectively removed on the surface of the channel regions of those MOS transistors which are intended to have a small gate dielectric thickness. The different thickness of the gate dielectrics can also be produced by selective oxidation, for example by a LOCOS process, using different oxidation times.

It is within the context of the invention for a read-out circuit to be implemented on the same semiconductor substrate, outside the cell field with the memory cells. During the production of the arrangement, MOS transistors which are required in the read-out circuit are preferably produced at the same time as the MOS transistors of the memory cells. The MOS transistors for the read-out circuit can in this case be implemented both as vertical MOS transistors having a current flow, between the source and drain, at right angles to the surface of the substrate, and as lateral MOS transistors having a current flow, between the source and drain, parallel to the surface of the substrate.

According to a first embodiment of the invention, the vertical MOS transistors of the memory cells in each case abut one flank of a trench. The opposite flank of the trench is covered by an insulating layer. The bit line and reference line run, as doped regions, buried in the substrate. The word lines are connected to the gate electrodes of the MOS transistors and run transversely with respect to the bit and reference lines. This embodiment can be produced with a minimum memory cell area of 4 F$^2$ (F: minimum structure size for the respective technology).

According to another embodiment of the invention, MOS transistors whose gate electrodes are insulated from one another are arranged on opposite flanks of each trench. The gate electrodes are in this case implemented as flank coverings or (spacer) on the respective flanks. The flank covering, made of conductive material, preferably doped polysilicon, runs over the entire length of the flank of the trench, so that the gate electrodes of all the MOS transistors which abut this flank of the trench are connected to one another. The flank covering forms the word line for these MOS transistors. This embodiment can be produced with a minimum memory cell area of 2 F$^2$.

If a 0.35 μm technology is used as the basis, the memory cell arrangement according to the invention can be produced with a memory cell area of approximately 0.25 μm$^2$. A read-only-memory cell arrangement having 100 to 500 Mbit and an area of approximately 1 cm$^2$ is thus technically and economically feasible.

Using data compression of approximately 10:1, as is known from specific algorithms or signal processors, up to 5 Gbit are then achieved. The read-only-memory cell arrangement according to the invention can thus be used for applications such as the digital storage of music, for example, for which compact disks have been used until now. PC software and games require a less high memory density and can therefore also be stored without data compression in a read-only-memory cell arrangement according to the invention.

BRIEF DESCRIPTION OF THE DRAWINGS

The invention is explained in more detail in the following text with reference to exemplary embodiments and the figures. For clarity, the illustrations in the figures are not to scale.

DETAILED DESCRIPTION OF THE PREFERRED EMBODIMENTS

Figure 1:
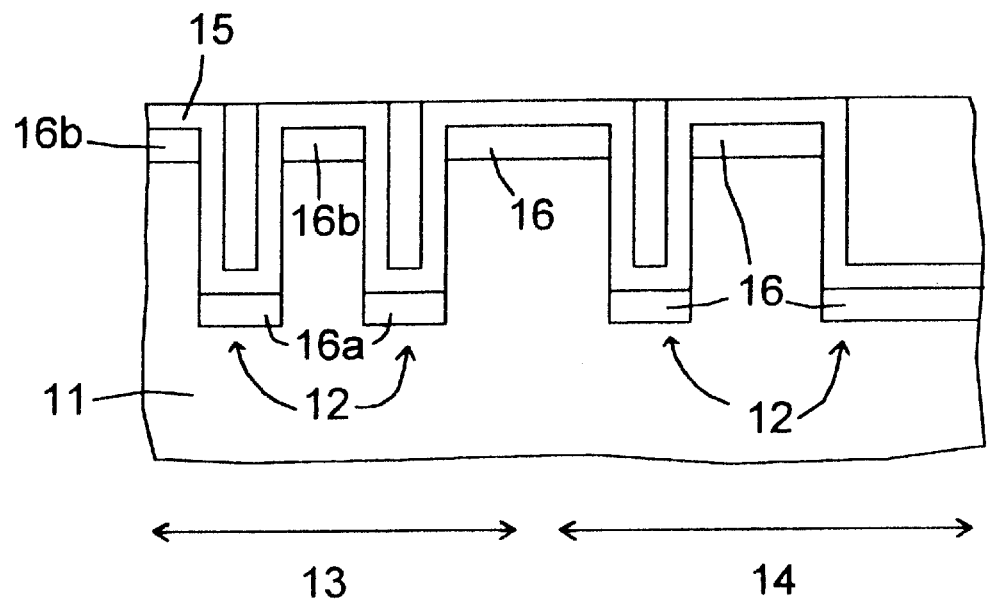
FIG. 1 is a side sectional view which shows a silicon substrate having trenches against which doped regions for the source, channel and drain abut and whose surface is covered with an insulating layer.

Trenches 12 are produced (see FIG. 1) by anisotropic etching, using a trench mask, in a substrate which is made of monocrystalline silica which is, for example, p-doped and has a dopant concentration of, for example, $5 \times 10^{16} \text{cm}^{-3}$. The substrate 11 comprises an area for a cell field 13 and an area for a periphery 14 in which, for example, a read-out circuit and/or amplifier, D/A converter and the like are produced. The area for the cell field 13 is indicated in FIG. 1 as the double arrow 13, and the area for the periphery 14 as the double arrow 14.

The trenches 12 run parallel over the substrate in the area of the cell field 13. They have a depth of, for example, 1 µm. The width of the trenches 12 is selected in accordance with the minimum structure size F of the technology used, for example 0.35 µm. The distance between the trenches 12 is likewise selected in accordance with the minimum structure size F, for example 0.35 µm. The length of the trenches at right angles to the plane of the drawing illustrated in FIG. 1 is, for example, 250 µm.

The trenches which are arranged in the periphery 14 are implemented for later production of MOS transistors for the drive circuit. The depth of these trenches 12 is the same as in the cell field 13, but the cross-section and distance between the trenches is matched to the requirements of the drive circuit. Greater separations and greater widths of the trenches are preferably implemented.

Subsequently, an insulating layer 15 is deposited over the entire area. The insulating layer 15 is produced, for example, using a CVD method by thermal decomposition of $Si(OC_2H_5)_4$ (TEOS) from $SiO_2$. The layer thickness of the insulating layer 15 is, for example, 100 nm. The insulating layer 15 has an essentially conformal edge covering.

$n^+$-doped regions 16 are subsequently produced, by ion implementation of, for example, phosphorus, on the base of the trenches 12 and between the trenches 12 on the surface of the substrate 11. The regions 16a, which are arranged on the base of the trenches 12, run at right angles to the plane of the drawing. In the area of the cell field 13, the trenches 16a are used as reference lines. $n^+$-regions 16b, which run on the surface of the substrate 11, likewise run at right angles to the plane of the drawing in FIG. 1. In the region of the cell field 13, the $n^+$-doped regions 16b are used as bit lines.

Figure 2:
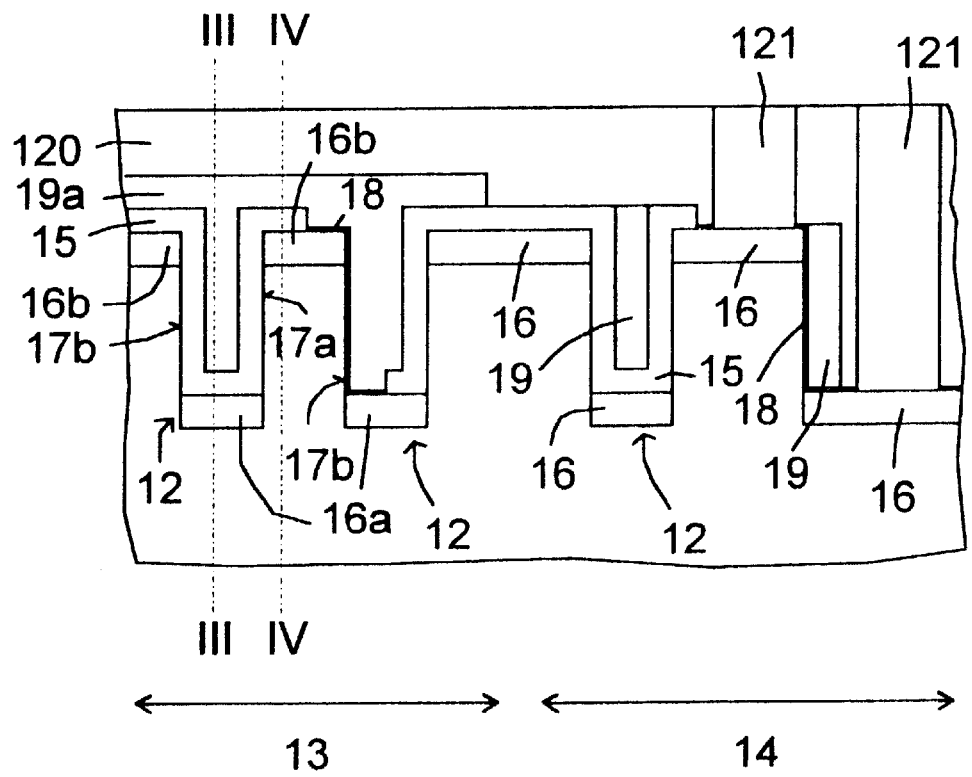
FIG. 2 is a side sectional view which shows the substrate after production of a memory cell according to the invention having MOS transistors with a thick and a thin gate oxide.

The insulating layer 15 is subsequently structured (see FIG. 2) using a mask made of photoresist, for example. In this case, a first flank 17a in each case remains covered by the insulating layer 15 in the area of the cell field. In contrast, the dielectric layer 15 is selectively removed on a second flank 17b, which is in each case opposite the first flank 17a. The dielectric layer 15 is removed wherever an MOS transistor having a lower operating voltage is intended to be produced later. The openings, which are in this case etched into the insulating layer 15, have a width of one structure size F and a length at right angles to the plane of the drawing in FIG. 2 of, likewise, one structure size F. However, the openings are laterally shifted by half a structure size ½F with respect to the arrangement of the trenches 12. Use is in this case made of the fact that the adjustment accuracy is always greater than the smallest structure size.

In the periphery 14, the insulating layer 15 is structured in accordance with the requirements of the drive circuit. It is preferably removed along flanks of trenches 12 on which vertical MOS transistors are intended to be formed.

The structuring of the insulating layer 15 is carried out, for example, using anisotropic etching methods.

This is followed by gate oxidation at, for example, 825° C. in a dry $O_2$ atmosphere, during which a gate dielectric 18 having a thickness of, for example, 7 nm, is formed on exposed silicon surfaces.

Subsequently, a polysilicon layer 19 is applied over the entire area and is n-doped by implantation or deposition. The polysilicon layer 19 is deposited with a layer thickness of, for example, 250 nm. In consequence, the polysilicon layer 19 completely fills the trenches 12 in the cell field.

The polysilicon layer 19 is subsequently structured using a mask. In this case, word lines 19a, which run in the form of strips and are arranged parallel, are formed in the area of the cell field 13. That part of the word lines 19a which extends into the trenches forms gate electrodes for the MOS transistors which are arranged on the second flanks 17b of the trenches. These MOS transistors each comprise an $n^+$-doped region 16a on the base of the respective trench 12, an $n^+$-doped region 16b which abuts against the surface of the substrate on the same second flank 17b, as well as that part of the substrate 11 which is arranged in between as the channel region, the gate oxide 18 or the insulating layer 15 as the gate dielectric, as well as the gate electrode. MOS transistors having a thin gate oxide 18 as the gate dielectric have a considerably smaller operating voltage than MOS transistors having the insulating layer 15 as the gate dielectric. If the thickness of the gate oxide layer 18 is 7 nm and the thickness of the insulating layer 15 is 100 nm and a selection signal of 3.5 volts is applied to the word line 19a, then only those MOS transistors which have a thin gate oxide 18 as the gate dielectric conduct.

Figure 3:
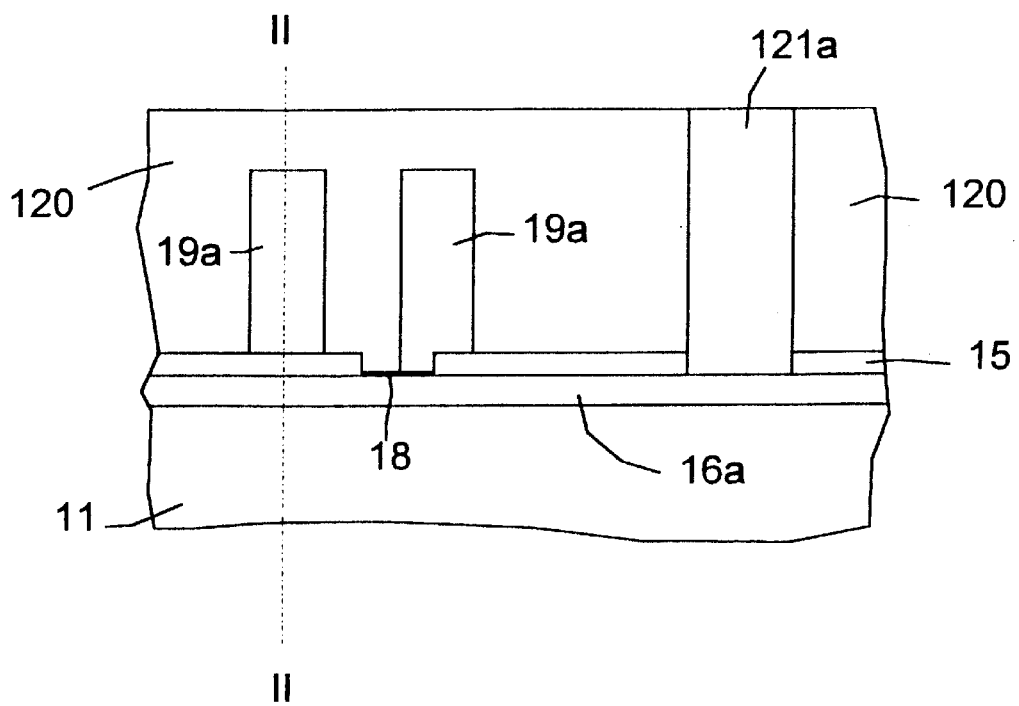
FIG. 3 is a view which shows the section designated by III—III in FIG. 2.
Figure 4:
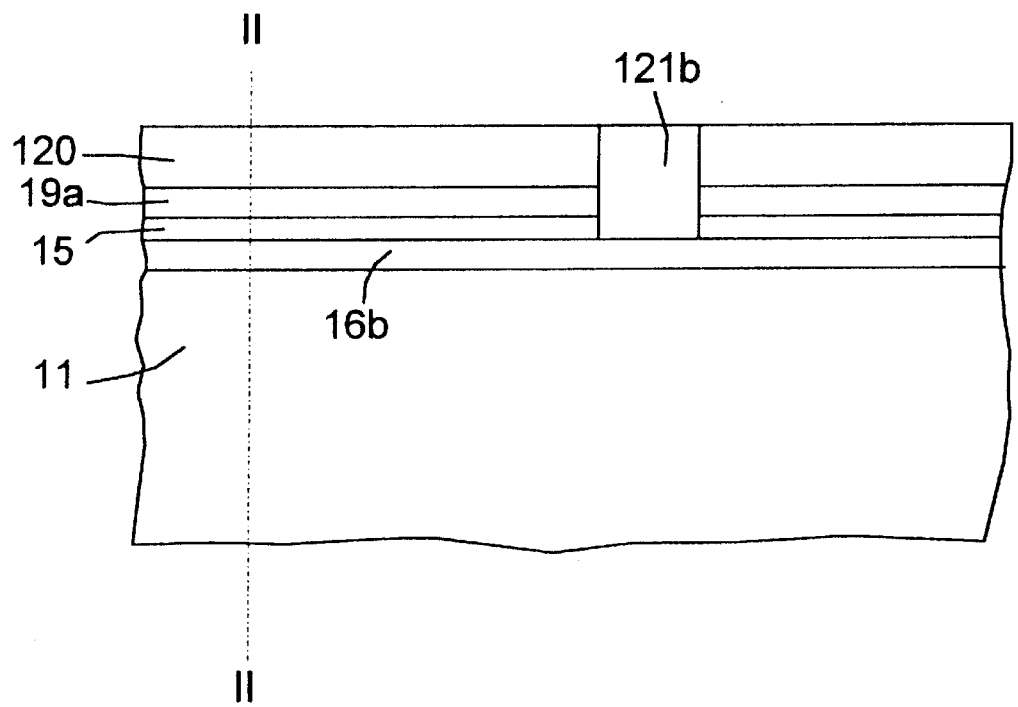
FIG. 4 is a view which shows the section designated by IV—IV in FIG. 2.

In order to complete the memory cell arrangement, an intermediate oxide layer 120 made of, for example, boron-phosphorus-silicate glass is deposited with a layer thickness of approximately 800 nm over the entire area. Contact holes to the reference lines 16a (see FIG. 3) to the bit lines 16b (see FIG. 4) and to the word lines and the MOS transistors in the periphery 14 are open in the intermediate oxide layer 120. A reference line contact 121a (see FIG. 3), a bit line contact 121b (see FIG. 4) and further contacts 121 (FIG. 2), for example for the MOS transistors in the periphery 14, are formed by filling the contact holes with tungsten.

The memory cell arrangement is completed by deposition and structuring of a metallization plane made of, for example, aluminium and by producing and structuring a passivation layer made of, for example, plasma oxide (these steps are not illustrated in detail).

Figure 5:
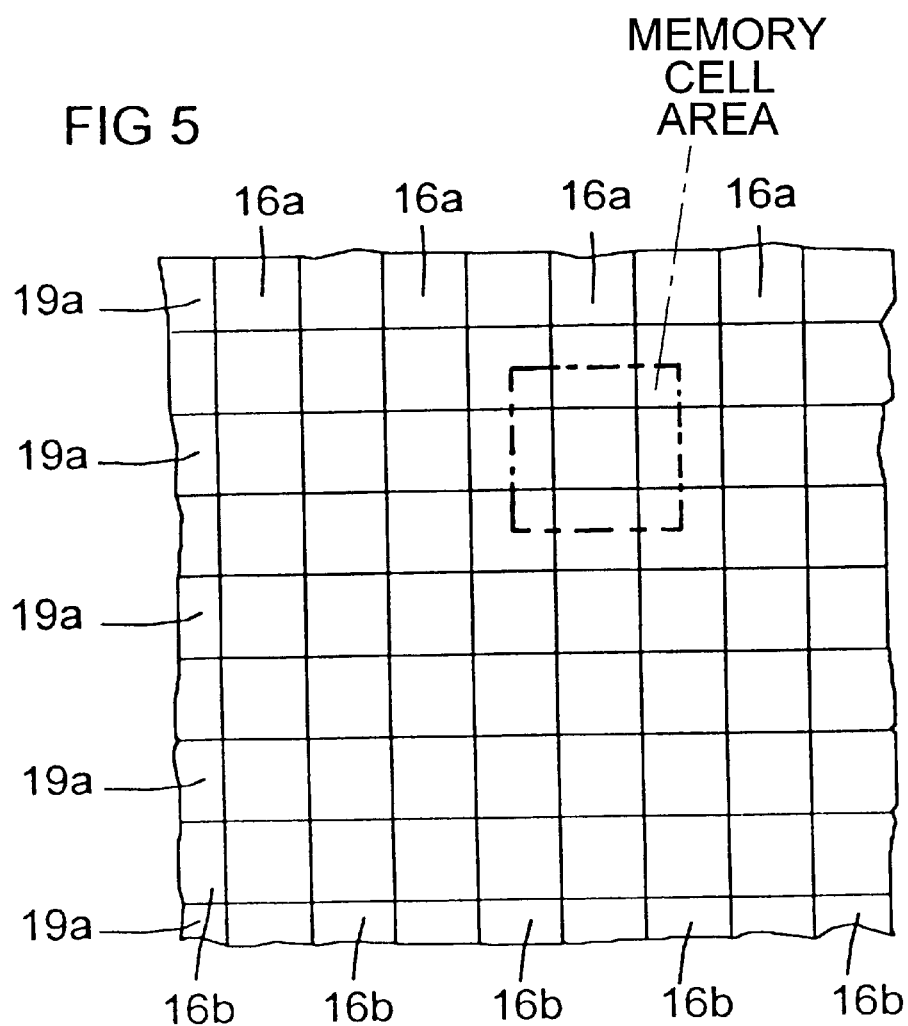
FIG. 5 shows a plan view of the cell field of the memory cell arrangement illustrated in FIG. 2, in which the individual memory cell has a space requirement of 4 F$^2$.

The word lines 19a run parallel to one another in the cell field 13 in this memory cell arrangement (see plan view in FIG. 5). The reference lines 16a run at right angles to the word lines 19a on the base of the trenches 12, which are likewise in the form of strips and are arranged parallel to one another. The bit lines 16b, which abut the surface of the substrate 11 between adjacent trenches 12, likewise run at right angles to the word lines 19a. A bit line 16b appears in each case between adjacent reference lines 16a in the plan view in FIG. 5. The area of a memory cell is shown as a dashed-dotted line in FIG. 5. Since the width of the word lines 19a, of the bit lines 16b and of the reference lines 16a is in each case a minimum structure size F of, for example, 0.35 µm and since their separation is likewise a minimum structure size F of, for example, 0.35 µm, an area of $4 F^2 = 0.5$ µm² is required for each memory cell. A memory density of 2 bit/µm² can thus be achieved.

The extent of the cell field 13 parallel to the surface of the substrate 11 is, for example, 250×250 µm. 125 kBits of information can be stored therein.

Figure 6:
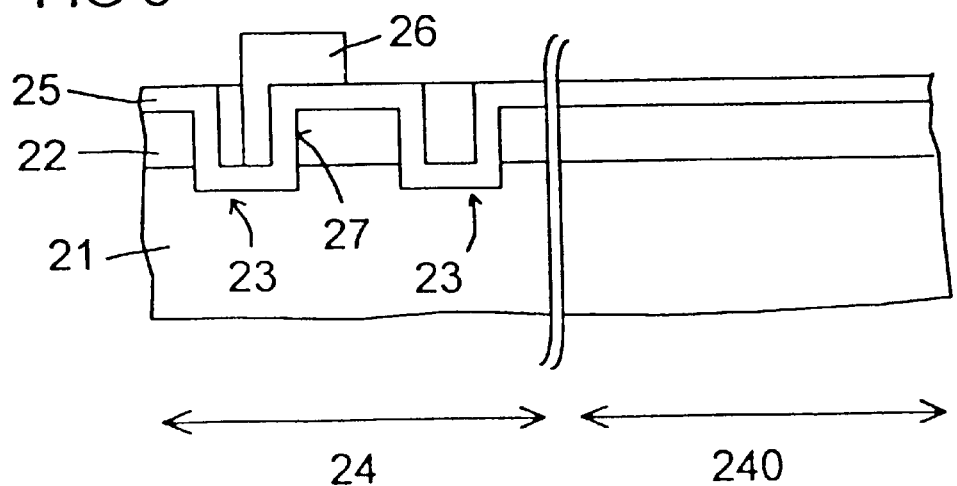
FIG. 6 is a side sectional view which shows a silicon substrate having trenches against which a source region and a channel region abut and which are covered with an insulating layer.

In a further exemplary embodiment shown in FIG. 6, a read-only-memory cell arrangement is constructed on a substrate 21 made of $n^+$-doped monocrystalline silicon. The substrate 21 is doped, for example, with arsenic and has a conductivity of approximately 100 mΩ cm. A p-doped layer 22 is arranged on the substrate 21, which layer 22 has a thickness of, for example, 0.3 µm and has boron doping of, for example, $5 \times 10^{17}$ cm$^{-3}$. The p-doped layer 22 is produced either by ion implantation or by epitaxial growth (see FIG. 6).

After production of an etching mask using photolithography (not illustrated in detail), trenches 23 are etched in the surface of the p-doped layer 22 using a dry-etching process. The trenches 23 extend into the n$^+$-doped substrate 21. They have a depth of, for example, 0.4 µm. The trenches 23 are arranged in a cell field 24 in the substrate 21. They run as parallel-arranged strips over the cell field 24. The width of the trenches 23 and their separation are in each case implemented with a minimum structure size F of, for example, 0.6 µm. The length of the trenches 23 at right angles to the plane of the drawing shown in FIG. 6 is, for example, 250 µm. The area of the cell field 24 parallel to the surface of the substrate 21 is, for example, 250×250 µm$^2$. In addition to the cell field 24, the substrate 21 comprises a periphery 240 in which a read-out circuit and the like are implemented.

An insulating layer 25 made of, for example, SiO$_2$ and having a thickness of, for example, 100 nm is produced over the entire area on the surface of the p-doped layer 22 and of the trenches 23. The insulating layer 25 is deposited using, for example, a TEOS method.

A photoresist mask 26 is subsequently produced which covers those areas of the insulating layer 25 in which MOS transistors having a higher operating voltage are intended to be formed in the cell field 24. An area with a size of 1 F×1 F, F=minimum structure size, for example 0.6 µm, is in this case covered per MOS transistor. The structures of the photoresist mask 26 are shifted laterally by ½F with respect to the arrangement of the trenches 23, so that the structures of the photoresist mask 26 cover a part of the flanks 27 of the trenches 23. Use is made of the fact here that the adjustment accuracy is greater than that corresponding to the minimum structure width.

The insulating layer 25 is structured, using the photoresist mask 26 as an etching mask, in an isotropic etching process using, for example, buffered hydrofluoric acid. The photoresist mask 26 is then removed.

Figure 7:
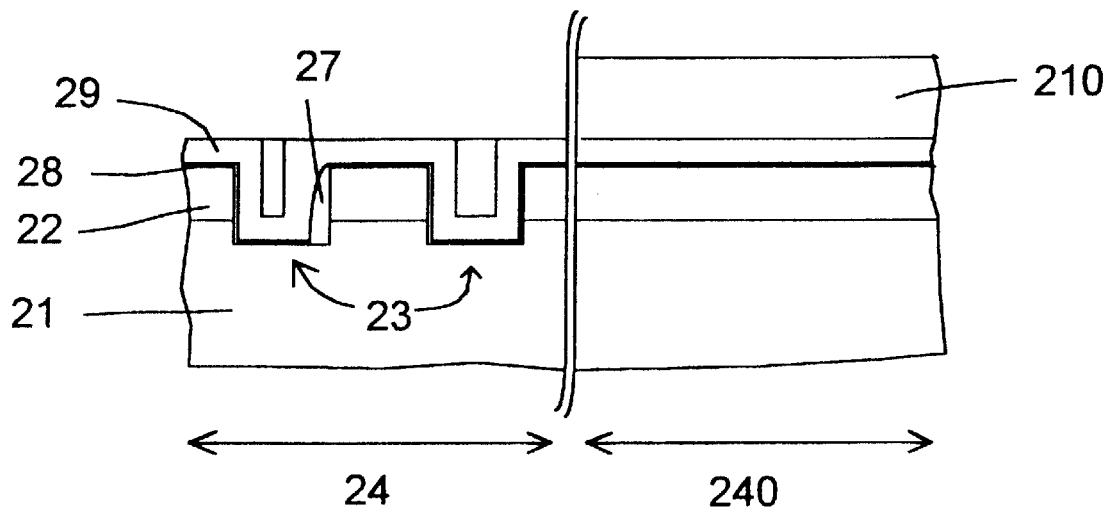
FIG. 7 is a side sectional view which shows the silicon substrate after production of an insulating flank covering, after gate oxidation and after deposition of a polysilicon layer.

As shown in FIG. 7, anisotropic etching is subsequently carried out selectively with respect to silicon, during which insulating flank coverings 27 (spacers) are formed from the structured, insulating layer. Reactive ion etching is in this case suitable, for example, as the anisotropic etching process (see FIG. 7).

The process steps for the formation of the insulating flank coverings 27 and for the structuring of the insulating layer 25 can also be carried out in the reverse sequence. In this case, the photoresist mask 26 is not produced until after the formation of the flank coverings 27.

This is followed by gate oxidation at, for example, 825° C. in an O$_2$ atmosphere, during which a gate oxide layer 28 having a thickness of, for example, 7 nm is produced on exposed silicon surfaces of the p-doped layer 22 and of the trenches 23. A polysilicon layer 29 is subsequently deposited over the entire area. The polysilicon layer 29 is n-doped by implantation or deposition. A mask 210, which covers the periphery 240, is formed using a photolithographic method. The cell field 24 is not covered by the mask 210. At the edge of the cell field 24, the mask 210 additionally covers connecting pads for word lines.

Figure 8:
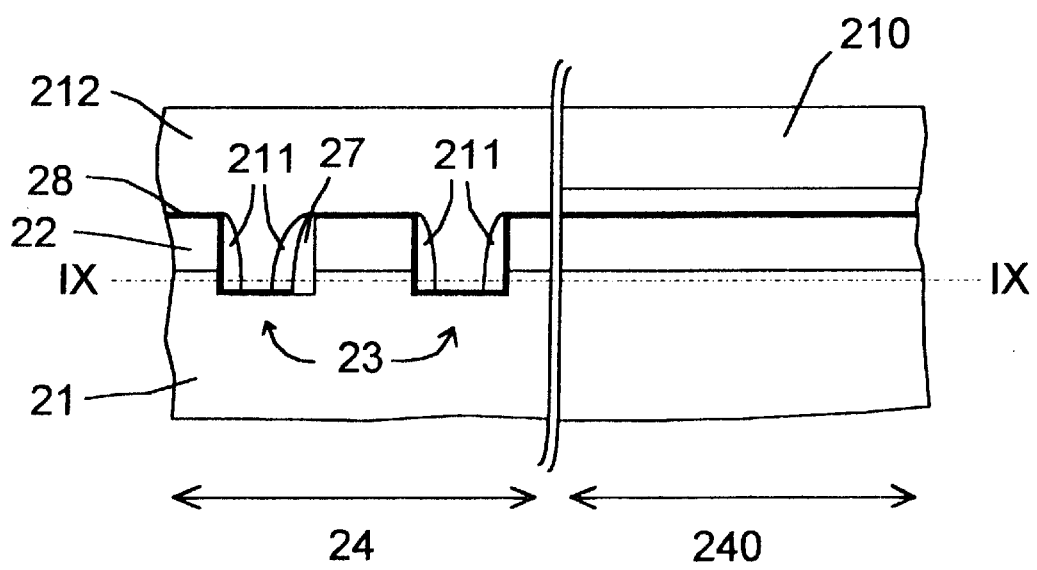
FIG. 8 is a side sectional view which shows the silicon substrate after production of conductive flank coverings from the doped polysilicon layer.

Conductive flank coverings 211 as shown in FIG. 8 are formed on the flanks of the trenches 23, from the doped polysilicon layer 29 in an anisotropic dry-etching process selectively with respect to SiO$_2$. The conductive flank coverings 211 are composed of doped polysilicon. The anisotropic etching, which is carried out, for example, by reactive ion etching, is extended until horizontal surfaces of the gate oxide layer 28 are exposed (see FIG. 8). By virtue of the production technique, the conductive flank coverings 211 surround the individual trenches 23 in an annular shape.

Figure 9:
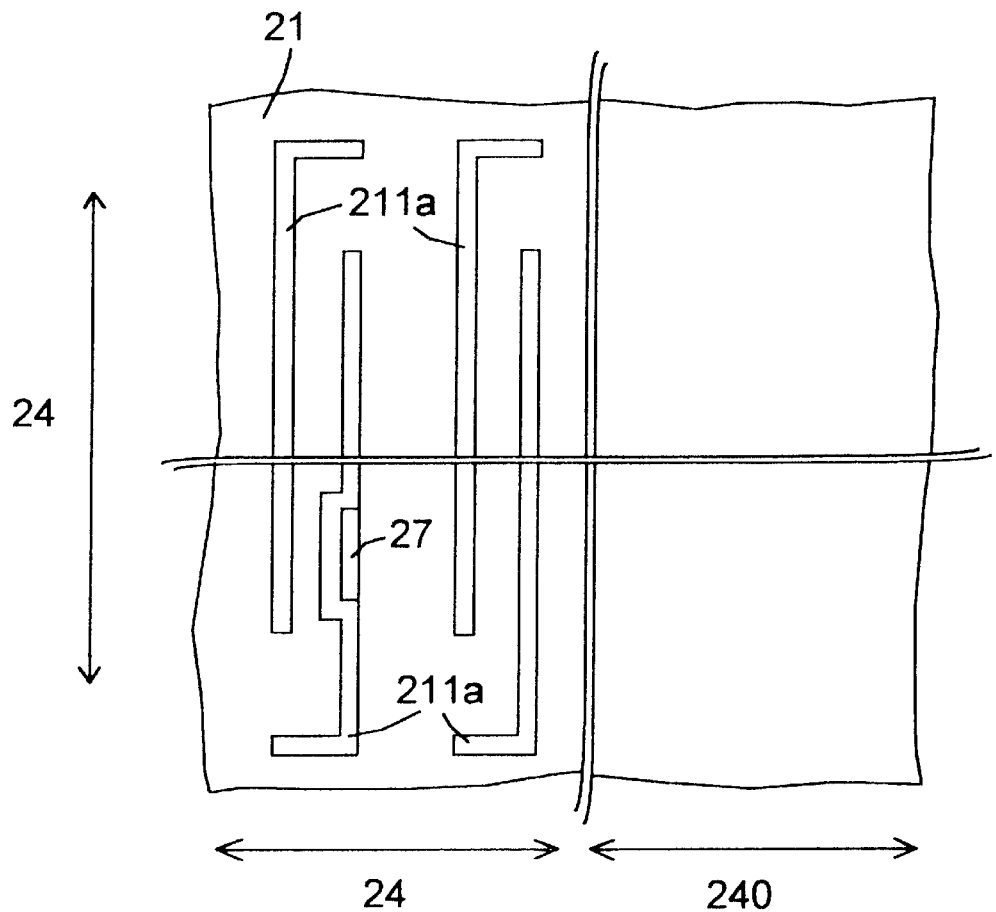
FIG. 9 shows the section designated by IX—IX in FIG. 8 after the conductive flank coverings have been removed.

In the next step, a further mask 212 is produced in order to interrupt the conductive flank coverings 211, which are annular in each trench 23, by etching at two points. The mask 212 thus essentially covers the cell field 24 and in each case leaves only two points of each conductive flank covering 211 uncovered. The conductive flank coverings 211 are preferably in each case interrupted on the long sides of the trench 23, the interruption points being arranged at opposite ends of the long sides (see FIG. 9 which illustrates a section IX—IX through FIG. 8). In this way, word lines 211a are produced which are essentially in the form of strips and are arranged in parallel. The word lines 211a each have an extension at right angles alternately on different sides of the cell field, via which extension contact is made with the word lines 211a in the further course. Since, is for adjacent word lines 211a, contact is in each case made on opposite sides of the cell field 24, this process step is not critical.

Figure 10:
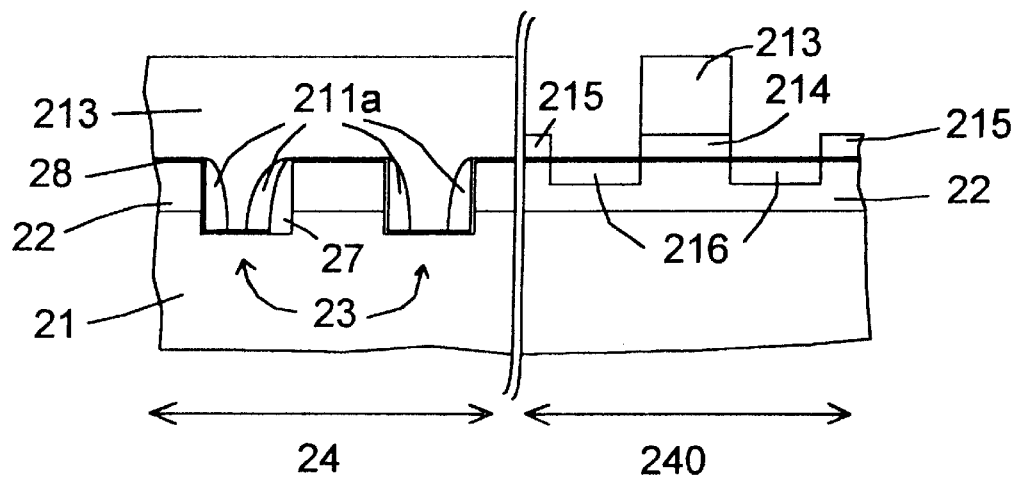
FIG. 10 is a side sectional view which shows the silicon substrate after the production of MOS transistors for a read-out circuit outside the cell field.

In FIG. 10, after removal of the masks 210 and 212, a further mask 213 is applied which completely covers the cell field 24 and, in the periphery 240, defines gate electrodes for MOS transistors of a read-out circuit (see FIG. 10). Gate electrodes 214 are formed in the periphery 240 by structuring the polysilicon layer 29 in an anisotropic dry-etching process using, for example., reactive ion etching. Source and drain regions 216 are formed by implantation adjacent to the gate electrodes 214 using a further mask 215 and the gate electrodes 214 as an implantation mask.

Figure 11:
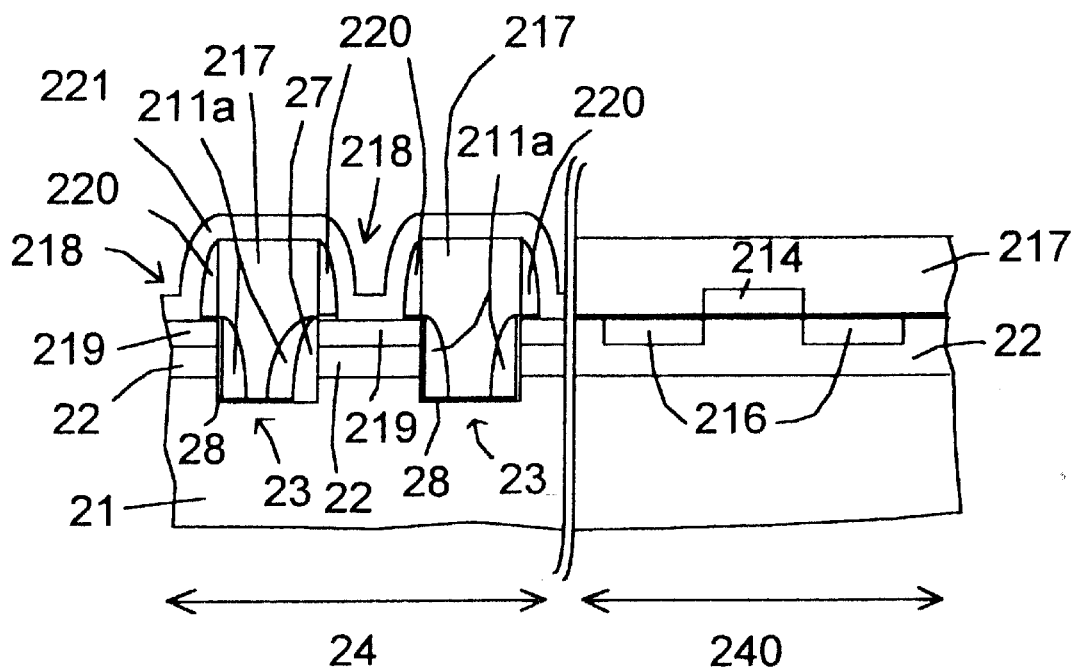
FIG. 11 is a side sectional view which shows the silicon substrate after the production of the memory cell arrangement according to the invention, opposite conductive flank coverings in each trench being insulated from one another by an insulating layer, drain regions having been produced between the trenches after the insulation of the conductive flank coverings, and the drain regions having been provided with a metallization.

In FIG. 11, after removal of the masks 213 and 215, a planarizing insulation layer 217 is produced over the entire area. This is done, for example, by decomposition of boron-phosphorus-silicate glass and allowing the glass to flow.

Contact holes to the surface of the p-doped layer 22 are opened between the trenches 23 in the cell field 24 using a further mask (not illustrated). Dry etching, for example reactive ion etching, is used to open the contact holes 218. This is followed by ion implantation, for example with arsenic, with an implantation energy of 25 keV and a dose of $5 \times 10^{15}$ cm$^{-3}$. During the implantation, n$^+$-doped regions 219 are formed on the surface of the p-doped layer 22 between adjacent trenches 23 (see FIG. 11). The n$^+$-doped regions 219, which have a dopant concentration of, for example, $10^2$ cm$^{-3}$, represent drain regions of MOS transistors which are arranged along the flanks of the trenches 23. The MOS transistors are formed from the n$^+$-doped substrate 21 which forms a source region, the p-doped layer 22 which forms a channel region, the n$^+$-doped region 219, the gate oxide layer 28 and/or the insulating flank covering 27 as well as the word line 211a, which forms the gate electrode. Those MOS transistors which have a part of the gate oxide layer 28 as the gate dielectric become conductive at a lower operating voltage than those MOS transistors which have an insulating flank covering 27 as the gate dielectric.

Doped regions can also be produced in the periphery 240 at the same time during this implantation step.

The planarizing layer 217 insulates the word lines 211a which are arranged on opposite flanks of the same trench 23 from one another. Since the trench width and the trench separation are in each case one minimum structure size, it is possible during the opening of the contact holes 218, whose width is likewise one minimum structure size, for word lines 211a to be exposed by etching in the upper area as a result of the adjustment accuracy. In order nevertheless to achieve reliable insulation of the word lines from one another, an SiO$_2$ layer having essentially conformal edge covering is deposited using a CVD method by thermal decomposition of Si(Oc$_2$H$_5$)$_4$ (TEOS). Insulating flank coverings 220 (or spacers), which additionally insulate exposed word lines 211a while contact holes are being etched, are formed on the flanks of the contact holes 218 in an anisotropic etching process which is selective with respect to silicon and with respect to boron-phosphorus-silicate glass, for example by reactive ion etching.

Finally, a metal layer made, for example, of aluminium is applied, for example, by sputtering, which layer is structured in an etching process using a photoresist mask in order to form bit lines 221. The bit lines 221 run at right angles to the word lines 211a. The bit lines 221 are connected in a self-adjusting manner via the contact holes 218 to the n$^+$-doped regions 219 of the MOS transistors. The n$^+$-doped substrate 21, which forms the other source/drain region for all the MOS transistors in the cell field 24, is provided with a substrate contact. This can be done on the rear side of the substrate 21 and at the edge of the cell field 24 via a contact hole which passes through the p-doped layer 22.

Figure 12:
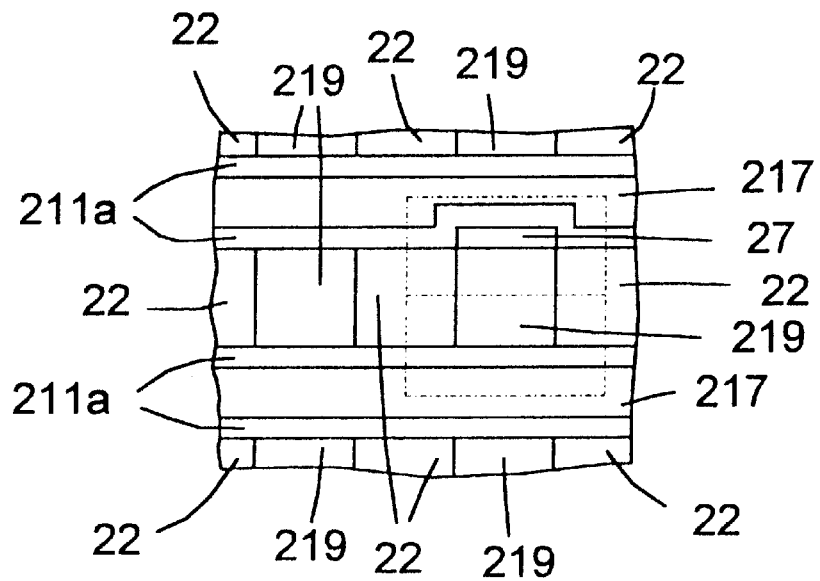
FIG. 12 shows a plan view of the cell field of the memory cell arrangement illustrated in FIG. 11, having a space requirement of the individual memory cell of 2 F$^2$.

FIG. 12 shows a plan view of a detail from the cell field of this embodiment of the memory cell arrangement according to the invention. Two memory cells abut each trench. Each memory cell comprises an MOS transistor which is formed from the n$^+$-doped region 219, the p-doped layer 22 as the channel region, the substrate 21 as the source/drain region, the gate dielectric and the word line 211a. The doped regions 219, 22 which are arranged between adjacent trenches 23 in each case belong to two MOS transistors. The area requirement for a memory cell is thus 2F$^2$, F being the minimum structure size, for example 0.6 $\mu$m. If a technology having a minimum structure size F of 0.25 $\mu$m is used, a memory cell having an area of 0.125 $\mu$m$^2$ can be produced in this way.

For clarity, only the insulating flank covering 27, but not the gate oxide layers 28, are shown in the plan view in FIG. 12.

The n$^+$-doped regions 219 of MOS transistors which are adjacent along one flank of a trench are insulated from one another. In the described embodiment, this insulation is implemented by the pn junctions which are in each case formed, at the edge of the contact holes 218, to the p-doped layer 22. Alternatively, the n$^+$-doped regions 219 can be insulated from one another by means of insulation trenches. These insulation trenches are produced by trench etching and filling with insulating material before the etching of the first-mentioned trenches 23.

A trench 23 which has insulating flank covering 27 and insulates the channel regions of the MOS transistors arranged at the edge from the periphery 240 is in each case provided at the edge of the cell field 24. The width of this trench can be designed to be greater than the structure size F in order to compensate for possible adjustment tolerances.

Although other modifications and changes may be suggested by those skilled in the art, it is the intention of the inventors to embody within the patent warranted hereon all changes and modifications as reasonably and properly come within the scope of their contribution to the art.

We claim:
1. A read-only-memory cell arrangement, comprising:
a substrate made of semi-conductor material, a bit line and a reference line and a word line in said substrate,
memory cells arranged in a cell field in a main surface of said substrate,
the memory cells each comprise
an MOS transistor having two source/drain regions, a channel region, a gate dielectric and a gate electrode, one of said source/drain regions being connected to said reference line and another of said source/drain region being connected to said bit line, and said gate electrode being connected to said word line, and a current flow runs between the source/drain regions essentially at right angles to the main surface,
the memory cells comprise first memory cells in which a first logic value is stored in that a thickness of the gate dielectric is dimensioned such that a current flows via the bit line when a selection signal is applied to the word line, and
the memory cells comprise second memory cells in which a second logic value is stored in that the thickness of the gate dielectric is dimensioned such that no current flows via the bit line when the selection signal is applied to the word line.

2. A memory cell arrangement according to claim 1, further comprising:
the substrate comprises monocrystalline silicon, at least in the region of the main surface,
substantially parallel trenches run in the main surface, the source/drain regions and the channel region each abut a surface of a respective one of said parallel trenches, the channel region abutting a flank of the trench which flank is at right angles to the main surface, and
a plurality of MOS transistors abut each trench.

3. A memory cell arrangement according to claim 2, wherein a thickness of the gate dielectric of the MOS transistors in the second memory cells is at least ten times a thickness of the gate dielectric of the MOS transistors in the first memory cells.

4. A memory cell arrangement according to claim 2, further comprising:
an insulation layer on a first flank of each trench, the channel regions of the MOS transistors which abut the respective trench abut a second flank of the respective trench, said second flank being opposite the first flank.

5. A memory cell arrangement according to claim 2,
each trench having a first flank and a second flank, which are opposite one another,
MOS transistors along the first flank and along the second flank,
the gate electrodes of the MOS transistors are flank covering made of conductive material,
an insulating flank covering in the second memory cells between the gate electrode and the respective flank of the trench,
the gate electrodes of the MOS transistors which are arranged along the first flank of a trench being electrically insulated from the gate electrodes of the MOS transistors which are arranged along the second flank of a same trench.

6. A memory cell arrangement according to claim 5, wherein
the gate electrodes of MOS transistors which are arranged along one flank being implemented as continuous flank covering which forms a word line and has a contact at an edge of the cell field, contacts to adjacent word lines being arranged on opposite sides of the cell field, contacts which are arranged on one side of the cell field being offset.

7. A memory cell arrangement according to claim 1, further comprising:

a read-out circuit having MOS transistors outside the cell field.

8. A method for production of a read-only-memory cell arrangement, comprising the steps of:

producing a cell field having memory cells each with one MOS transistor in a substrate made of semiconductor material, etching trenches which run substantially parallel in a main surface of the substrate, producing doped regions for the MOS transistors in the substrate, which doped regions abut the surface of a trench, channel regions in each case abutting a flank of the trench which flank is at right angles to the main surface, and a plurality of MOS transistors abutting each trench, producing a gate dielectric and a gate electrode on the surface of the channel regions, producing the gate dielectric with a smaller thickness in MOS transistors which store a first logic value than in MOS transistors which store a second logic value, such that a current flows through the MOS transistor when a read-out signal is applied to the gate electrode of an MOS transistor which is storing the first logic value, while no current flows through the MOS transistor when the same read-out signal is applied to the gate electrode of an MOS transistor which is storing the second logic value.

9. A method according to claim 8, further comprising the steps of:

doping the substrate by a first conductance type, after the etching of the trenches, applying an insulating layer having an essentially conformal edge covering over an entire area of said substrate, carrying out an implantation using ions doped by a second conductance type, which is opposite to the first conductance type, during which implantation doped regions are produced on the base of the trenches and in the main surface between the trenches, removing the insulating layer by etching, using a photoresist mask, at least along those flanks of the trenches abutted by the channel regions of MOS transistors which store the first logic value, carrying out a gate oxidation in order to produce each the gate dielectric on exposed flanks of the trenches, depositing a conductive layer having essentially conformal edge covering, to form the gate electrodes, structuring the conductive layer such that word lines are produced which are in a form of strips and run transversely with respect to the trenches, providing the doped regions on a base of the trenches and between the trenches with contacts at the edge of the cell field.

10. A method according to claim 9, further comprising the steps of:

during the implantation in order to produce the doped regions in the cell field, forming source/drain regions for MOS transistors of a drive circuit outside the cell field, during the gate oxidation, forming gate dielectrics for the MOS transistors of the drive circuits, and during the structuring of the conductive layer, forming gate electrodes of the MOS transistors of the drive circuit from the conductive layer.

11. A method according to claim 9, wherein the substrate is composed of monocrystalline silicon, the insulating layer is formed from $SiO_2$, the gate dielectric is formed from $SiO_2$, the conductive layer is formed from doped polysilicon.

12. A method according to claim 8, further comprising the steps of:

doping the substrate by a first conductance type, producing a well which is doped by a second conductance type, which is opposite to the first conductance type, abuts the main surface and covers at least an area for the cell field, etching the trenches so deeply that the substrate which is doped by the first conductance type is exposed at least on a base of the trenches, producing an insulating layer over an entire area of said substrate, removing the insulating layer by etching, using a mask, along flanks of the trenches which abut the MOS transistors which store the first logic value, after removal of the mask by anisotropic etching which is selective with respect to the substrate, forming insulating flank coverings from the structured insulating layer, carrying out a gate oxidation to produce a gate oxide layer each on exposed flanks of the trenches, depositing a conductive layer having essentially conformal edge covering, forming conductive flank coverings, which line the flanks of the trenches in an annular shape, from the conductive layer by anisotropic, selective etching, interrupting an annular, conductive flank coverings by etching each at at least two points, producing a planarizing insulation layer over the entire area of said substrate, etching contact holes, which extend to a surface of the doped well, in the planarizing insulation layer, producing doped source/drain regions, which abut the main surface in an area of the contact holes, by implantation, providing the contact holes with a metallization, and forming contacts to the conductive flank coverings at an edge of the cell field.

13. A method according to claim 12, further comprising the steps of:

depositing an insulating layer having essentially conformal edge covering in the contact holes before the formation of the metallization, selectively etching the insulating layer using an anisotropic, selective etchant, to at least partly expose a surface of the source/drain regions which abut the main surface.

14. A method according to claim 12, further comprising the steps of:

forming insulating trenches, for insulation, between source/drain regions which are adjacent along a trench, which insulating trenches are produced by trench etching and filling with insulating material before the etching of the first-mentioned trenches.

15. A method according to claim 12, further comprising the steps of:

forming gate electrodes for MOS transistors of a drive circuit from the conductive layer outside the cell field, forming source/drain regions, which are doped by the first conductance type, for the MOS transistors of the drive circuit by implantation before application of the planarizing insulation layer.

16. A method according to claim 12, wherein the substrate is composed of monocrystalline silicon, the insulating layer and the gate oxide layer are formed from $SiO_2$, the conductive layer is formed from doped polysilicon, the planarizing insulation layer is formed from boron-phosphorus-silicate glass.

17. A read-only-memory cell arrangement, comprising:

a substrate made of semi-conductor material, a bit line and a reference line and a word line in said substrate, memory cells arranged in a cell field in a main surface of said substrate, the memory cells each comprise a single MOS transistor having two source/drain regions, a channel region, a gate dielectric and a gate electrode, one of said source/drain regions being connected to said reference line and another of said source/drain region being connected to said bit line, and said gate electrode being connected to said word line, and a current flow runs between the source/drain regions essentially at right angles to the main surface, the memory cells comprise first memory cells in which a first logic value is stored in that a thickness of the gate dielectric is dimensioned such that a current flows via the bit line when a selection signal is applied to the word line, and the memory cells comprise second memory cells in which a second logic value is stored in that the thickness of the gate dielectric is dimensioned such that no current flows via the bit line when the selection signal is applied to the word line.

* * * * *